(12) United States Patent
Liebmann et al.

(10) Patent No.: US 12,557,392 B2
(45) Date of Patent: Feb. 17, 2026

(54) HIGHLY REGULAR LOGIC DESIGN FOR EFFICIENT 3D INTEGRATION

(71) Applicant: Tokyo Electron Limited, Tokyo (JP)

(72) Inventors: Lars Liebmann, Mechanicville, NY (US); Jeffrey Smith, Clifton Park, NY (US); Daniel Chanemougame, Nishayuna, NY (US); Anton deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 662 days.

(21) Appl. No.: 17/880,321

(22) Filed: Aug. 3, 2022

(65) Prior Publication Data

US 2022/0375921 A1 Nov. 24, 2022

Related U.S. Application Data

(63) Continuation of application No. 16/847,001, filed on Apr. 13, 2020, now Pat. No. 11,488,947.

(60) Provisional application No. 62/879,721, filed on Jul. 29, 2019.

(51) Int. Cl.
*H10D 89/10* (2025.01)
*H10D 88/00* (2025.01)

(52) U.S. Cl.
CPC ............. *H10D 89/10* (2025.01); *H10D 88/00* (2025.01)

(58) Field of Classification Search
CPC ................................ H10D 89/10; H10D 88/00
See application file for complete search history.

(56) References Cited

U.S. PATENT DOCUMENTS

| | | | |
|---|---|---|---|
| 7,919,793 B2 | 4/2011 | Iwata | |
| 9,337,099 B1 * | 5/2016 | Jain | H10D 89/10 |
| 9,997,598 B2 | 6/2018 | Smith et al. | |
| 10,236,302 B2 | 3/2019 | Correale, Jr. et al. | |
| 10,366,196 B2 | 7/2019 | Correale, Jr. et al. | |
| 10,453,850 B2 | 10/2019 | Smith et al. | |
| 10,529,830 B2 | 1/2020 | Tapily et al. | |
| 10,573,655 B2 | 2/2020 | Smith et al. | |
| 10,734,383 B2 | 8/2020 | Smayling et al. | |
| 11,488,947 B2 * | 11/2022 | Liebmann | H10D 88/00 |

(Continued)

FOREIGN PATENT DOCUMENTS

| | | |
|---|---|---|
| CN | 101388391 A | 3/2009 |
| JP | H07202144 A | 8/1995 |

(Continued)

OTHER PUBLICATIONS

Taiwanese Office Action issued Feb. 19, 2024 in Taiwanese Patent Application No. 109125226 (with English translation), 25 pages.

(Continued)

*Primary Examiner* — Shaun M Campbell
(74) *Attorney, Agent, or Firm* — Oblon, McClelland, Maier & Neustadt, L.L.P.

(57) ABSTRACT

An integrated circuit includes an array of unit cells, each unit cell of which including field effect transistors arranged in a stack. Local interconnect structures form select conductive paths between select terminals of the field effect transistors to define cell circuitry that is confined within each unit cell. An array of contacts is disposed on an accessible surface of the unit cell, where each contact is electrically coupled to a corresponding electrical node of the cell circuitry.

20 Claims, 10 Drawing Sheets

(56) References Cited

U.S. PATENT DOCUMENTS

| | | |
|---|---|---|
| 2006/0289940 A1 | 12/2006 | Hyun et al. |
| 2009/0026503 A1 | 1/2009 | Tsuda |
| 2010/0187573 A1 | 7/2010 | Iwata |
| 2013/0126978 A1* | 5/2013 | Becker ................ H10D 84/038 257/369 |
| 2017/0371995 A1 | 12/2017 | Correale, Jr. et al. |
| 2017/0373090 A1* | 12/2017 | Correale, Jr. ........ H10D 84/907 |
| 2018/0026042 A1 | 1/2018 | Smith et al. |
| 2018/0040695 A1 | 2/2018 | Smith et al. |
| 2018/0047832 A1 | 2/2018 | Tapily et al. |
| 2018/0190670 A1* | 7/2018 | Ryckaert .............. H10D 62/122 |
| 2018/0240802 A1 | 8/2018 | Smith et al. |
| 2019/0148407 A1 | 5/2019 | Guo et al. |
| 2019/0326301 A1 | 10/2019 | Smith et al. |
| 2019/0355756 A1 | 11/2019 | Nelson et al. |
| 2020/0098897 A1 | 3/2020 | Tapily et al. |
| 2020/0119048 A1 | 4/2020 | Guo et al. |
| 2020/0235098 A1 | 7/2020 | Li et al. |
| 2020/0286831 A1 | 9/2020 | Shao et al. |
| 2020/0328210 A1 | 10/2020 | Wu et al. |
| 2020/0328212 A1* | 10/2020 | Wu ........................ H10D 88/00 |
| 2020/0373240 A1* | 11/2020 | Vadi ...................... H01L 23/535 |

FOREIGN PATENT DOCUMENTS

| | | |
|---|---|---|
| JP | 2007-13156 A | 1/2007 |
| JP | 2009-49370 A | 3/2009 |
| JP | 2016-213286 A | 12/2016 |
| WO | WO 2017-111866 A1 | 6/2017 |
| WO | WO 2018-013315 A1 | 1/2018 |

OTHER PUBLICATIONS

Korean Office Action issued Jan. 7, 2025 in Korean Patent Application No. 10-2022-7004576 (with English translation), 13 pages.

International Search Report and Written Opinion issued Sep. 23, 2020 in PCT/US2020/038047, 12 pages.

Office Action mailed Jun. 21, 2025, in Chinese Application No. 202080053747.7 filed Jun. 17, 2020 (w/machine-generated English translation).

* cited by examiner

HIGHLY REGULAR LOGIC DESIGN FOR EFFICIENT 3D INTEGRATION

RELATED APPLICATION DATA

This application is a continuation of U.S. application Ser. No. 16/847,001, filed Apr. 13, 2020, which is based upon and claims the benefit of priority from U.S. Provisional Patent Application No. 62/879,721, filed Jul. 29, 2019, the entire contents of which are incorporated herein by reference.

BACKGROUND

This disclosure relates to integrated circuits and the fabrication of microelectronic devices.

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits using 2D fabrication techniques. Scaling efforts have greatly increased the number of transistors per unit area in 2D circuits, yet these scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration (3Di) is seen as a viable option for continuing semiconductor scaling efforts despite inevitable saturation in critical dimension scaling. As the contacted gate pitch reaches its scaling limit due to manufacturing variability and electrostatic limitations, two-dimensional transistor density scaling can go no further. Even experimental new transistor designs, such as vertical channel gate all around transistors, that may one day be able to overcome these contacted gate pitch scaling limits, have scaling issues of their own due to resistance, capacitance, and reliability concerns, thereby limiting the density with which transistors can be wired into circuits.

3Di, i.e., the vertical stacking of multiple devices, aims to overcome these scaling limitations by increasing transistor density in volume rather than area. While this concept has been successfully demonstrated and implemented by the flash memory industry (e.g., 3D NAND), mainstream complementary metal-oxide-semiconductor (CMOS) very large scale integration (VLSI) manufacturers of CPU and GPU products remain hesitant to adopt 3D integration as a primary means of moving the semiconductor roadmap forward. The main reason for this lack of adoption of 3Di for anything other than niche applications (e.g., memory stacked on top of logic for machine learning accelerators used in artificial intelligence chips) is the inherent inefficiency of known proposals.

One approach to successful semiconductor scaling is to leverage a modest increase in process complexity and cost across a substantially larger number of transistors. In 2D scaling this was accomplished by reducing feature size and increasing transistor density at largely fixed wafer manufacturing cost. 3D integration approaches that double transistor density in volume by incurring twice the manufacturing cost, however, do not offer viable scaling solutions. Successful scaling using 3Di lies in radical reduction of process and design complexity to minimize node-to-node cost increase.

SUMMARY

An integrated circuit includes an array of unit cells, each unit cell of which including field effect transistors arranged in a stack. Local interconnect structures form select conductive paths between select terminals of the field effect transistors to define cell circuitry that is confined within each unit cell. An array of contacts is disposed on an accessible surface of the unit cell, where each contact is electrically coupled to a corresponding electrical node of the cell circuitry.

In an additional or alternative aspect of the inventive concept disclosed herein, the integrated circuit includes a functionalization layer comprising electrically conductive wiring segments formed between select contacts on the respective accessible surfaces of one or more unit cells in the array.

In another additional or alternative aspect of the inventive concept disclosed herein, the unit cells have a common footprint and are positioned in the array so that diffusion breaks embracing the cell circuitry of each unit cell align with the diffusion breaks in adjacent unit cells to form continuous spaces that extend across all unit cells in respective columns of the array.

In yet another additional or alternative aspect of the inventive concept disclosed herein, the integrated circuit includes power walls disposed in the continuous spaces that provide electrical power to at least the unit cells in the respective columns of the array.

In another additional or alternative aspect of the inventive concept disclosed herein, upper surfaces of the respective power walls are exposed on the accessible surface of each unit cell in the columns of the array.

In yet another additional or alternative aspect of the inventive concept disclosed herein, the cell circuitry is the same across all unit cells in the array.

In another additional or alternative aspect of the inventive concept disclosed herein, the cell circuitry is constructed from like front end-of-line and middle end-of-line processes.

In yet another additional or alternative aspect of the inventive concept disclosed herein, the front-end of line and middle-end of line processes include multiplication patterning processes.

In another additional or alternative aspect of the inventive concept disclosed herein, the multiplication patterning processes include directed self-assembly and/or self-aligned multiple-exposure patterning.

In yet another additional or alternative aspect of the inventive concept disclosed herein, the field effect transistors are stacked in complementary pairs.

In another additional or alternative aspect of the inventive concept disclosed herein, gates of the complementary pairs of field effect transistors are commonly connected.

In yet another additional or alternative aspect of the inventive concept disclosed herein, the complementary pairs in the stack of field effect transistors is greater than one in number.

It is to be understood that this summary section does not specify every embodiment and/or incrementally novel aspect of the present disclosure or claimed invention. Instead, this summary only provides a preliminary discussion of different embodiments and corresponding points of novelty over conventional techniques. The Detailed Description section and corresponding figures of the present disclosure provide additional details and/or possible perspectives of the invention and embodiments.

BRIEF DESCRIPTION OF THE DRAWINGS

FIG. 2, including

DETAILED DESCRIPTION

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, the word exemplary is used herein to mean, "serving as an example, instance or illustration." Any embodiment of construction, process, design, technique, etc., designated herein as exemplary is not necessarily to be construed as preferred or advantageous over other such embodiments. Particular quality or fitness of the examples indicated herein as exemplary is neither intended nor should be inferred.

Techniques herein include integrated circuits and methods of fabrication of semiconductor devices that use common front end-of-line and middle end-of-line structures for all logic cells and then functionalize these generic unit cells in low-level metallization. One embodiment includes an integrated circuit having an array of unit cells. Each unit cell may have a same unit cell height and a same unit cell width. Each unit cell may have at least two vertical levels of transistors in which a first field effect transistor is positioned above a second field effect transistor in a stack. Each field effect transistor may have a gate-all-around channel. Each unit cell may include local interconnect wiring that electrically connects source/drain and gate structures. One or more wiring levels may be positioned directly above the array of unit cells, in which at least two different types of functional logic cells may be formed from the array of unit cells. Accordingly, such techniques can provide 3D integration having process simplification and cost reduction.

Techniques herein include those by which integrated circuits are physically constructed or otherwise realized as a physical object, including techniques by which the integrated circuits are designed and fabricated. Indeed, those having skill in the relevant art(s) and an understanding of this disclosure will be able to carry the principles described herein into suitable electronic/engineering design automation (EDA) and foundry platforms through which the structures described herein can be physically constructed and/or used as components of a broader circuit design. Techniques herein find particular applicability to monolithically integrated 3D CMOS (complementary metal-oxide-semiconductor) circuits, such as described in U.S. Provisional Patent Application Ser. No. 62/727,097, filed on Sep. 5, 2018, entitled, "Architecture Design and Processes for Manufacturing Monolithically Integrated 3D CMOS Logic and Memory," which is incorporated by reference herein it its entirety.

Functionalization of logic can be carried out as a back end-of-line (BEOL) operation through, for example, metallization over a readily-accessible grid of contacts providing electrical access to internal circuit components of the three-dimensional unit cell.

Embodiments herein include enforcing a common 2 contacted poly pitch (cpp) footprint on the unit cell width. Although this restriction limits the unit cell to a single transistor track flanked on either side by single diffusion breaks, this design enables substantial scaling benefits and facilitates significant complexity reduction. For example, designing all unit cells onto a fixed-width footprint results in alignment of diffusion breaks across all rows of a corresponding logic block. This arrangement facilitates formation of local power rails that run in the unoccupied space of the diffusion break, giving unobstructed access to the source regions of devices without blocking signal tracks. This arrangement also provides a highly uniform local layout environment, eliminating complex layout dependent device variability that has become a substantial performance detractor in advanced technology nodes. Using unit cells with equal width as well as the commonly used equal height allows logic functions which require more transistors than are available in the single transistor track wide stack to be composed by optimally abutting unit cells either vertically or horizontally, providing a critical degree of freedom in simplifying wire shapes.

Figure 1:
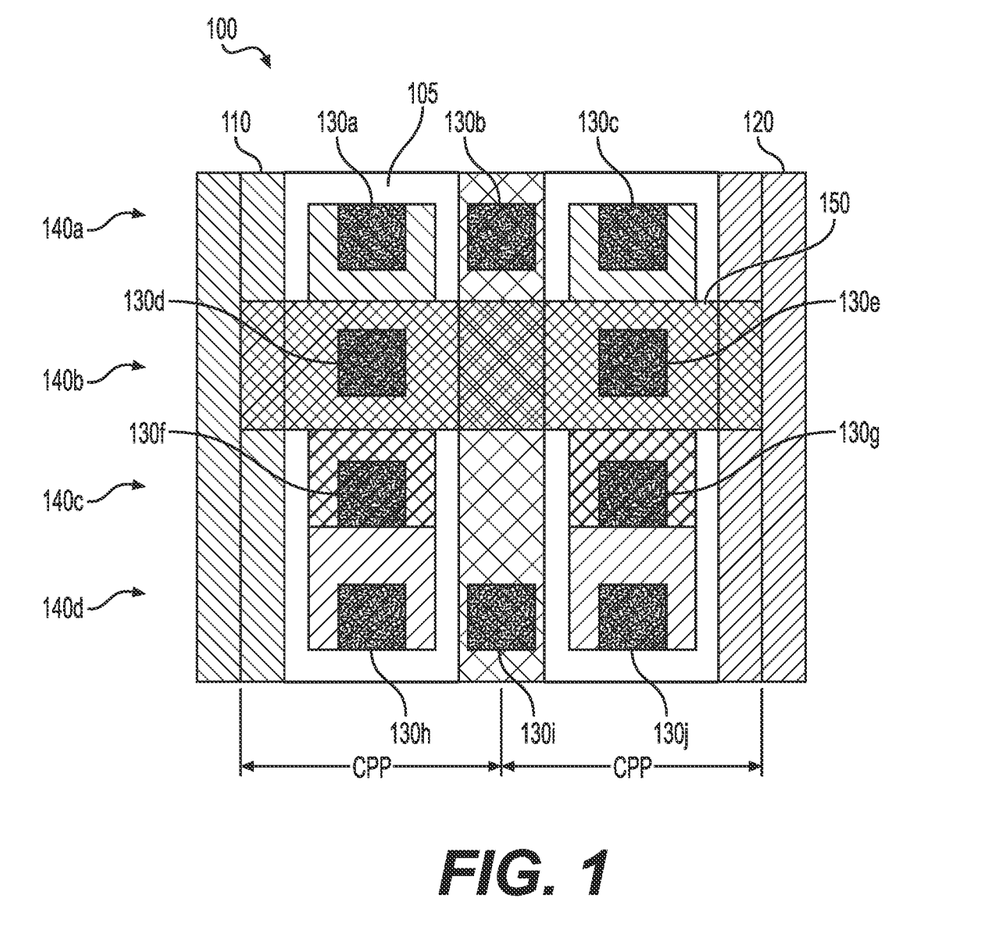
FIG. 1 is an illustration of a top-down view of an example unit cell with which the principles of this disclosure can be embodied.

FIG. 1 is an illustration of a top-down view of an example unit cell 100 with which the principles of this disclosure can be embodied. The cell view of FIG. 1 depicts an accessible surface 105 of unit cell 100 across which a plurality of cell contacts 130a-130j, representatively referred to herein as cell contact(s) 130, are disposed. Each cell contact 130 is electrically connected to a node of cell circuitry constructed beneath accessible surface 105. For example, unit cell 100 may comprise a double stack of complementary field-effect transistor (CFET) circuits, i.e., two pairs of common gate n-type and p-type transistor pairs stacked one atop another in what is referred to herein as an active device stack. An example of such an active device stack is illustrated in FIG. 2. In the example embodiment of FIG. 1, such a device stack may be confined to a 4 track (4T) tall, as illustrated by tracks 140a-140d, representatively referred to herein as track(s) 140, and 2 cpp wide cell, as indicated in FIG. 1. In such a double stack configuration, four (4) active channels may be established in respective active regions 150 and controlled by way of voltages applied to and interconnections established across cell contacts 130, where, for example, cell contacts 130a and 130c may be connected to the bottom p-diffusion layer, cell contacts 130d and 130e may be connected to the top p-diffusion layer, cell contacts 130f and 130g may be connected to the top n-diffusion layer, cell contacts 130h and 130j may be connected to the bottom n-diffusion layer and cell contacts 130b and 130i may be connected to common polysilicon gates of the upper and lower CFET pairs, respectively. One may also view these contacts as follows: cell contacts 130a and 130c may serve as source and drain contacts for a p-type transistor of a lower CFET pair, cell contacts 130d and 130e may serve as source and drain contacts for a p-type transistor of an upper CFET pair, cell contacts 130f and 130g may serve as source and drain contacts for an n-type transistor of the upper CFET pair, 130h and 130j may serve as source and drain contacts for an n-type transistor of the lower CFET pair and cell contacts 130b and 130i may serve as common gate contacts to the upper and lower CFET pairs. This contact assignment is not essential to practicing the inventive concept described herein; other contact assignments are possible and may depend on the interior architecture of the unit cell.

In addition to cell contacts 130, accessible surface 105 further exposes upper surfaces of a VDD power wall 110 and a VSS power wall 120. In certain embodiments, VDD power wall 110 and VSS power wall 120 are constructed as walls extending upward from the substrate surface to accessible surface 105. Accordingly, VDD power wall 110 and VSS power wall 120 are accessible to local interconnects interior to unit cell 100 as well as to wiring at accessible surface 105. Accordingly, such local interconnects may connect directly to VDD power wall 110 and/or VSS power wall 120, such as for transistor biasing, as opposed to making such connection at accessible surface 105. In certain embodiments, VDD power wall 110 and VSS power wall 120 may each be situated in the space of a single diffusion break and, as illustrated in FIG. 1, may each traverse cell boundaries so as to be available to adjacent cells.

Also illustrated in FIG. 1 are active regions 150 of which there are four (4) in exemplary unit cell 100. However, it is to be understood the four active regions may each comprise multiple channels in which current flows from source to drain (or vice-versa). For example, each active region 150 may comprise multiple current-carrying components, e.g., nanowires or nanosheets, in a gate-all-around (GAA) configuration. Other active regions may also be realized in embodiments of the invention, usually depending on the technology node of which the unit cell is designed and manufactured.

FIG. 2, which comprises FIGS. 2A-2E, is a diagram revealing the internal, 3D structure of unit cell 100 through several cross-sectional views. The different views are depicted in FIGS. 2A-2D and are referenced to FIG. 2E, which illustrates the accessible surface 105 and cell contacts 130 depicted in and described with reference to FIG. 1. It is to be understood that FIG. 2, including FIGS. 2A-2E, is a schematic illustration and is not drawn to scale.

Figure 2A:
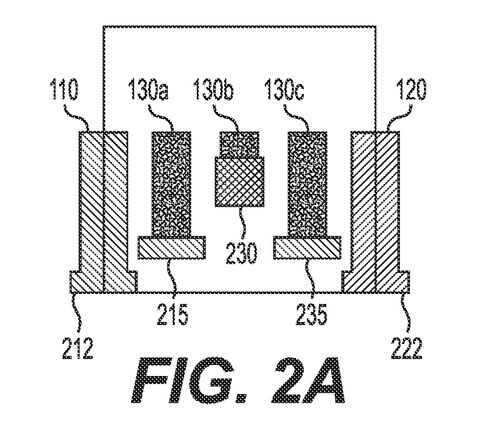
FIGS. 2A-2E, is a diagram revealing the internal, 3D structure of the example unit cell illustrated in FIG. 1.

FIG. 2A represents a cut through bottom local interconnect 215, which may connect cell contact 130a to a source/drain of the lower-most transistor 210a in active device stack 250, local interconnect 235, which may connect cell contact 130c to a drain/source of the lower-most transistor 210a in active device stack 250, and a top gate polysilicon interconnect 230, which may connect cell contact 130b to the common gate of the upper-most CFET pair comprising transistors 210c and 210d. It is to be noted that, in certain embodiments, VDD power wall 110 and VSS power wall 120 may be connected to buried power rails, representatively illustrated at buried power rails 112 and 122, respectively, as well as being exposed at upper surfaces thereof on accessible surface 105.

Figure 2B:
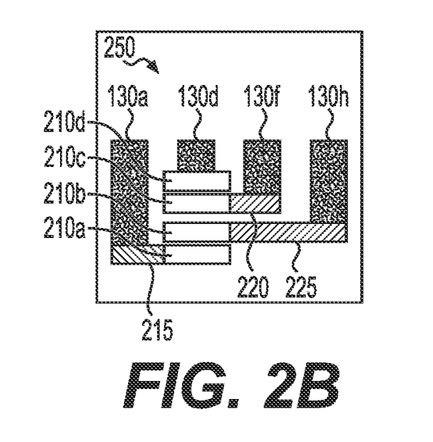

FIG. 2B represents a cut through local interconnect 215, local interconnect 220, which may connect cell contact 130f to a drain/source of transistor 210c in active device stack 250, local interconnect 225, which may connect cell contact 130h to a source/drain of transistor 210c of active device stack 250 and cell contact 130d, which may be directly connected to source/drain of upper-most transistor 210d of active device stack 250. Additionally, FIG. 2B represents a cut through a portion of active device stack 250.

Figure 2C:
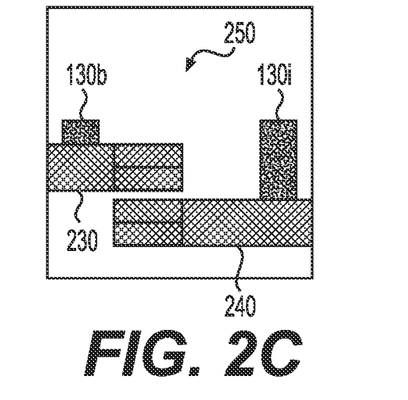

FIG. 2C represents a cut through common gates in active device stack 250. Each of the upper and lower CFET pairs may be connected to respective cell contacts 130b and 130i through polysilicon interconnects 230 and 240.

Figure 2D:
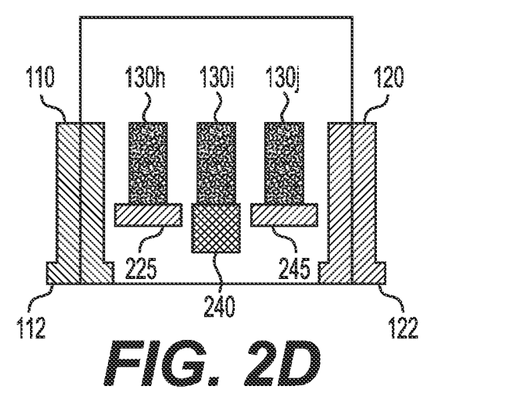
Figure 2E:
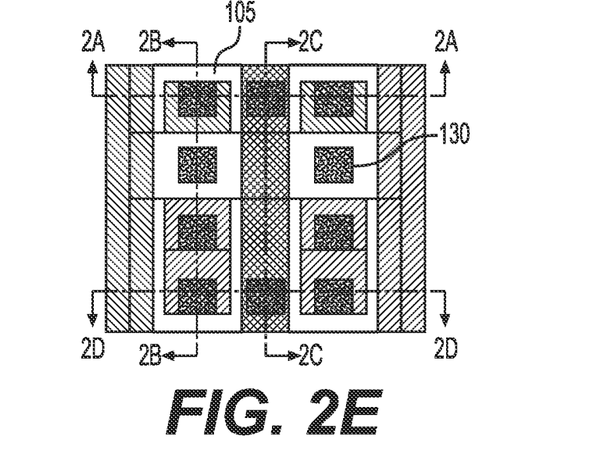

FIG. 2D represents a cut through local interconnect 225, which may connect cell contact 130a to a source/drain of the lower-most transistor 210a in active device stack 250, interconnect 245, which may connect cell contact 130j to a drain/source of the upper-most transistor 210d in active device stack 250, and a bottom gate polysilicon interconnect 240, which may connect cell contact 130i to the common gate of the lower-most CFET pair comprising transistors 210a and 210b.

According to embodiments of the inventive concept disclosed herein, signal and power connections may be routed on a plane above active device stack 250, e.g., on accessible surface 105, to be functionalized in local conductive wiring on what is referred to herein as a functionalization layer. Local power rails may be run in the space of a single diffusion break. Accordingly, each unit cell can have uniform dimensions and can optionally have uniform geometry including transistor, gates, and local interconnects.

Figure 3A:
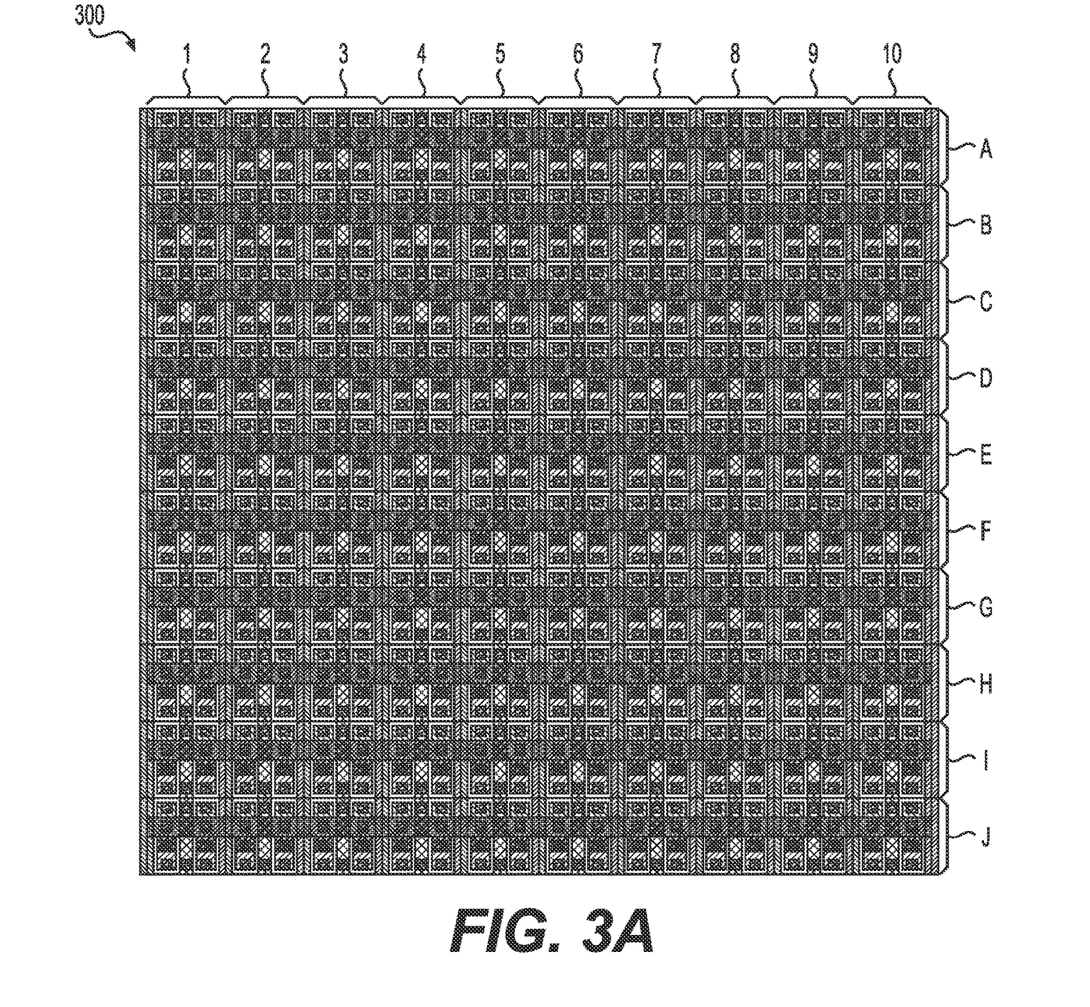
FIG. 3A is an illustration of a 10×10 array of unit cells in accordance with the principles described herein to highlight the regularity of the front end-of-line (FEOL) and middle end-of-line (MEOL) layouts.

FIG. 3A is an illustration of a 10×10 array 300 of unit cells to highlight the regularity of the front end-of-line (FEOL) and middle end-of-line (MEOL) layouts. For purposes of identification, each cell in array 300 is associated in FIG. 3A with a column and row identifier, e.g., unit cell 3F refers to the unit cell in column 3 and row F of array 300. It should be observed that, insofar as FEOL and MEOL layouts are concerned, array 300 is highly regular and, as such, various manufacturing processes can be leveraged to simplify overall manufacturing efforts and decrease costs. In certain embodiments, array 300 may be a monolithic integrated circuit, wherein the unit cells are all constructed on a single substrate (not illustrated).

Figure 3B:
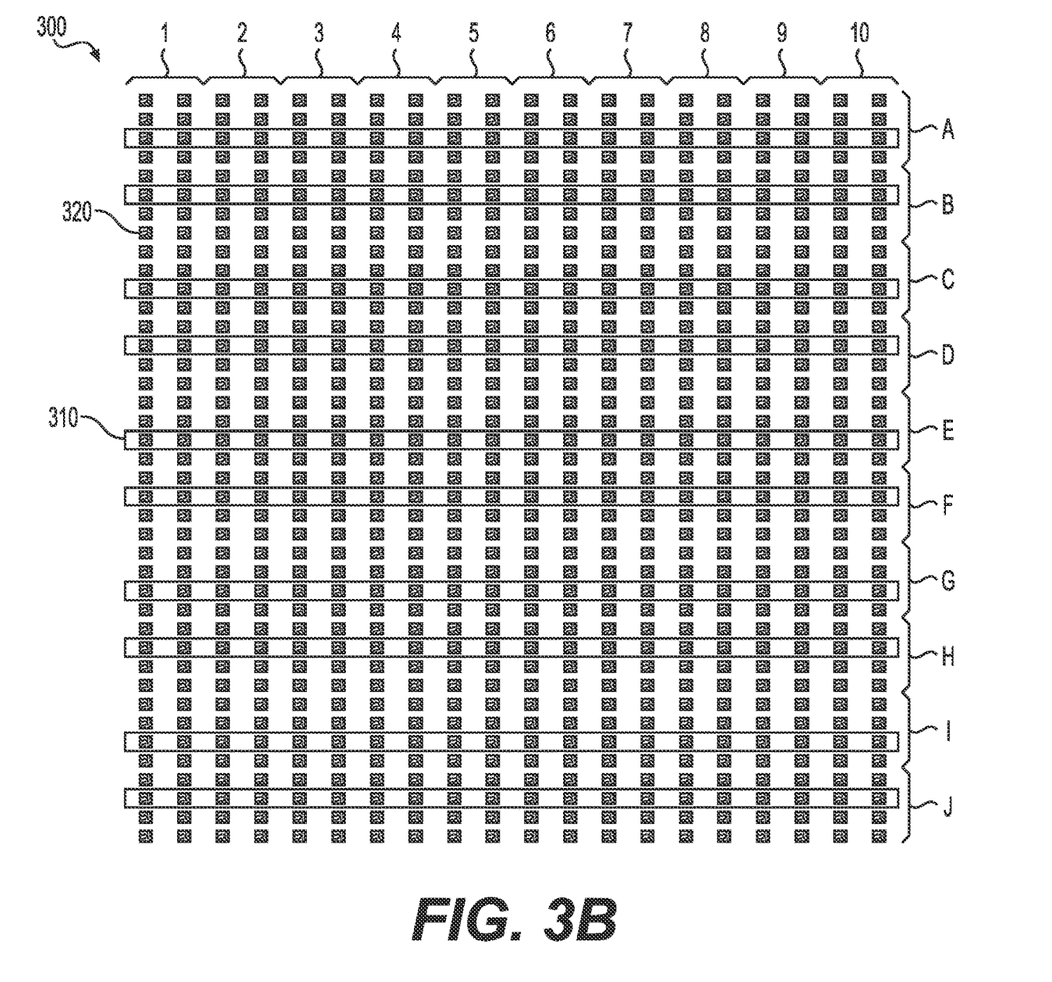
FIG. 3B is an illustration of a unit cell array in which only the active channel regions and source/drain contacts in accordance with the principles described herein are depicted.

FIG. 3B is an illustration of unit cell array 300 in which only the active channel regions, representatively illustrated at active channel region 310, and source/drain contacts, representatively illustrated at source/drain contact 320. FIG. 3B highlights the possible use of low-cost frequency multiplication patterning techniques (e.g., directed self-assembly or self-aligned multiple patterning, e.g., self-aligned double/triple/quadruple patterning to image these critical features.

Figure 3C:
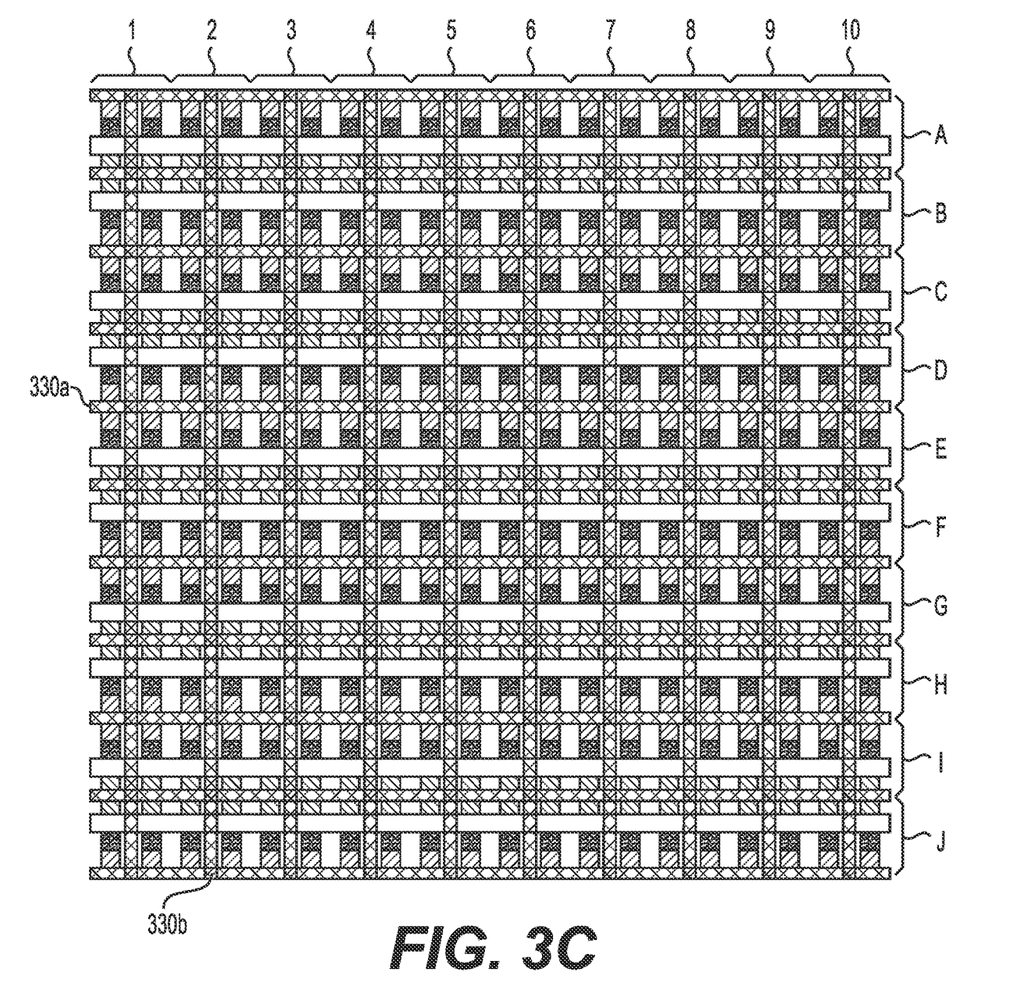
FIG. 3C is an illustration of unit cell array in which a grid of cut-masks in accordance with the principles described herein are depicted.

FIG. 3C is an illustration of unit cell array 300 in which a grid of cut-masks, representatively illustrated at cut-masks 330a and 330b, are depicted that can optionally provide a low cost, high precision solution to form line-ends for local interconnects and poly gates.

Figure 3D:
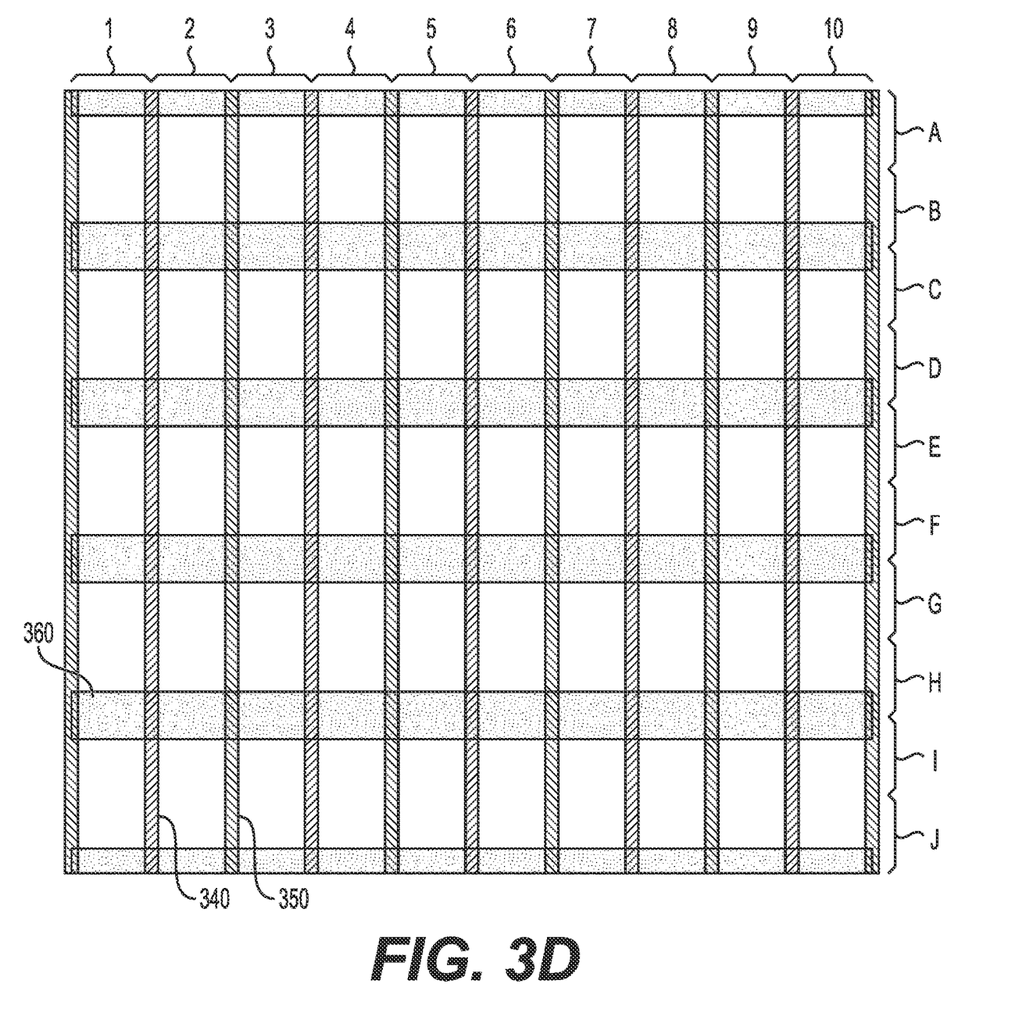
FIG. 3D is an illustration of a unit cell array in which VDD power rails and VSS power rails in accordance with the principles described herein are depicted.

FIG. 3D is an illustration of unit cell array 300 in which VDD power rails, representatively illustrated at VDD power rail 340, and VSS power rails, representatively illustrated at VSS power rail 350, are depicted. It is to be understood that these power rails are positioned in the space left by diffusion breaks. Also, illustrated in FIG. 3D, are macro-level power rails, representatively illustrated at macro-level power rail 360, that supply power to the local power rails.

Figure 4:
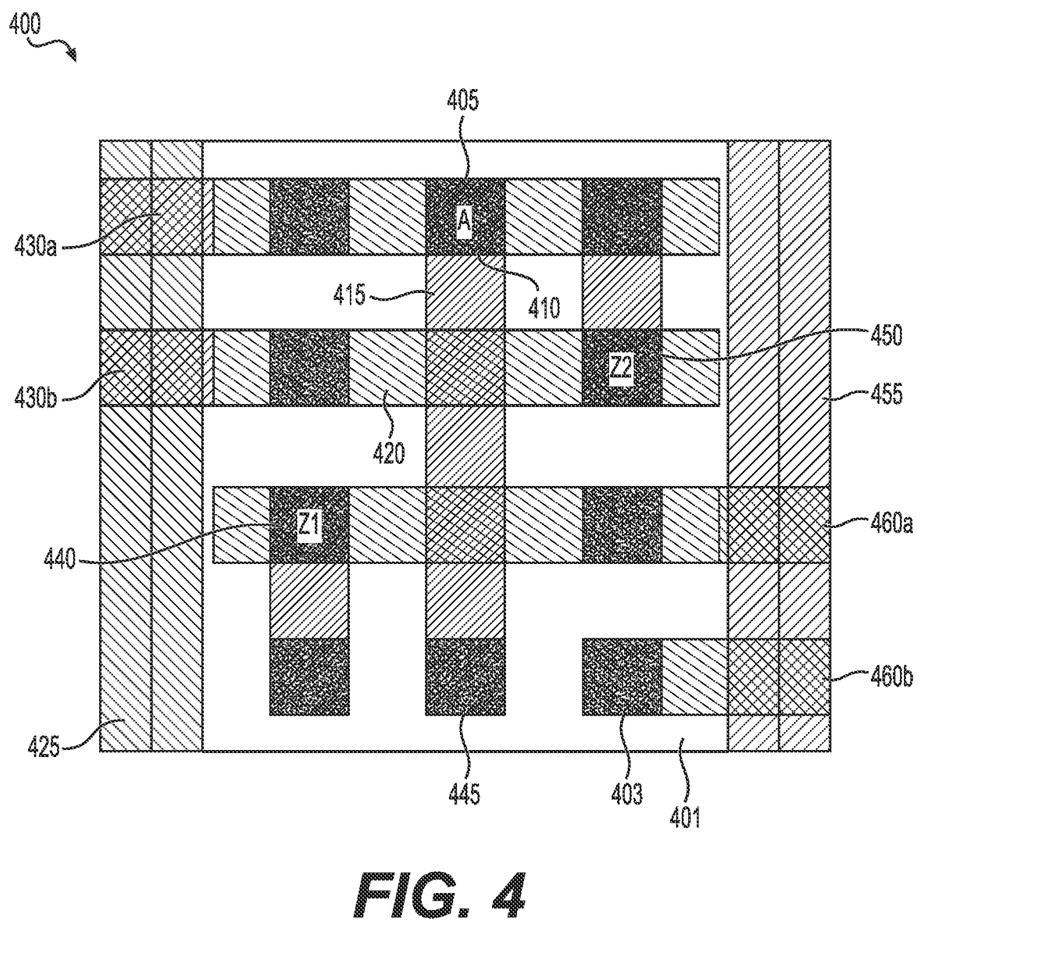
FIG. 4 is an illustration of a top-down view of a unit cell that has undergone functionalization to form a two-fingered inverter (INV2) logic cell in accordance with the principles described herein.

FIG. 4 is an illustration of a top-down view of a unit cell 400 that has undergone functionalization via back-end of line (BEOL) processes. Unit cell 400 may possess the same internal architecture as unit cell 100 described above. The cell contacts, representatively illustrated at cell contact 403, may be distributed across accessible surface 401 so as to connect to the same internal circuitry nodes to which like-positioned cell contacts 130 of unit cell 100 are connected. In the example illustrated, first metal 415 and second metal 420 are disposed over accessible surface 401 so as to connect target-specific cell contacts 403 and form thereby a specific logic cell, which, in the case of FIG. 4, is a two finger inverter (INV2). In this example embodiment, three levels of highly regularized and unidirectional metal connections are used. First, VDD power taps 430a and 430b and VSS power taps 460a and 460b may connect specific source/drain contacts to the local power-rail, i.e., VDD power rail 425 and VSS power rail 455. On a separate layer of local wiring, vertically-aligned source/drain and/or gate contacts may be connected by $1^{st}$ metal, representatively illustrated at $1^{st}$ metal connection 415. In yet another layer of local wiring, input/output pins of the logic cell, e.g., top gate contact 405 as electrically connected to bottom gate contact 445 serving as the logic cell input pin, cell contact 440 serving as an n-type output pin and cell contact 450 serving as a p-type output pin, may be constructed via $2^{nd}$ metal, representatively illustrated at $2^{nd}$ metal connection 420, to which a circuit router can connect other circuit components. In certain embodiments, a signal via, representatively illustrated at 410, may be constructed to connect an input pin attached to $2^{nd}$ metal disposed horizontally across accessible surface 401 to local wiring of $1^{st}$ metal disposed vertically across accessible surface 401.

Figure 5:
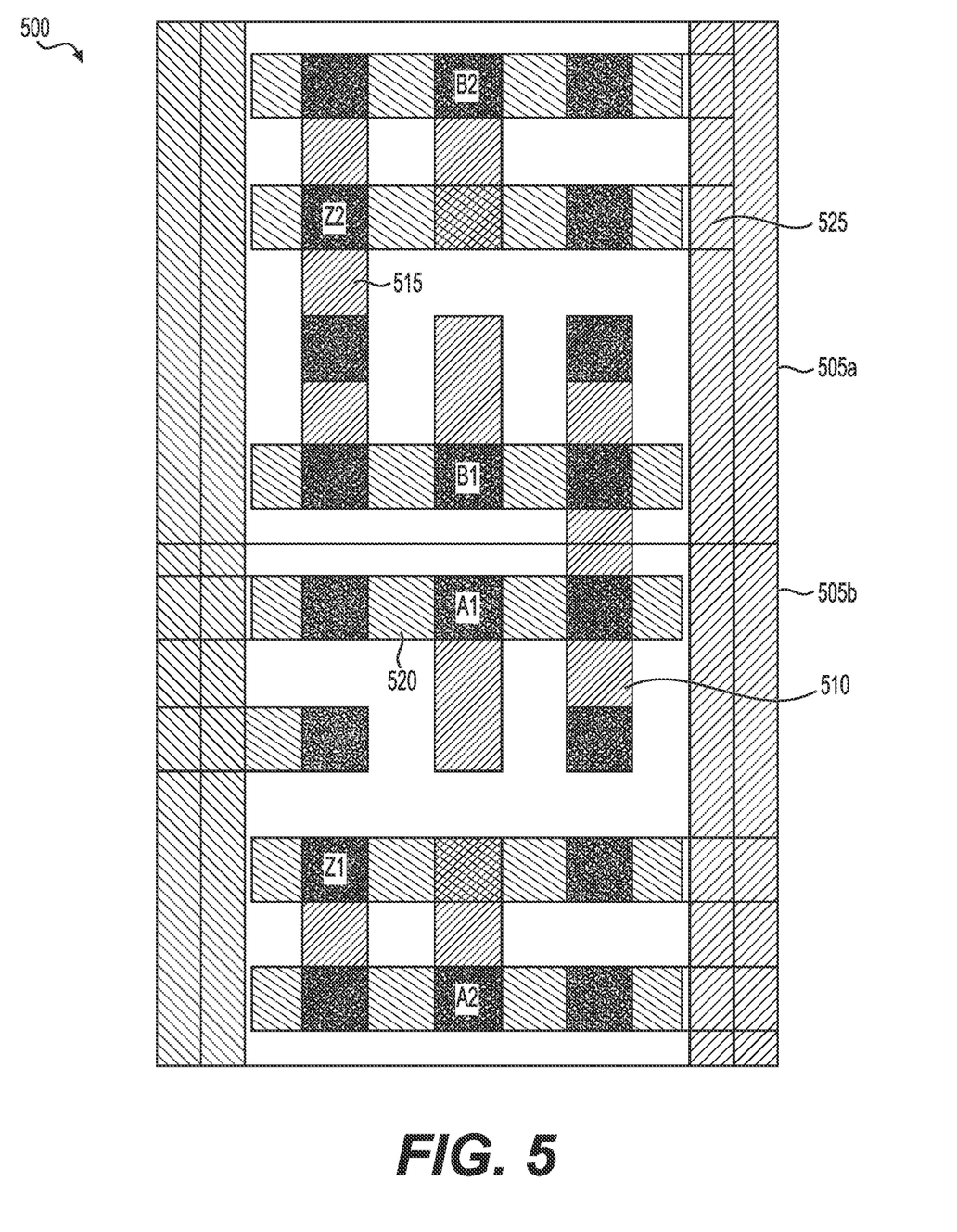
FIG. 5 is an illustration of a top-down view of a pair of unit cells as functionalized into a two input and-or-invert (AOI22) logic cell in accordance with the principles described herein.

FIG. 5 is an illustration of a top-down view of a pair of unit cells 505a and 505b, each of which can be constructed identically to unit cell 100 of FIGS. 1 and 2, as functionalized into a two input and-or-invert (AOI22) logic cell 500. With similarity to FIG. 4, $1^{st}$ metal connections, representatively illustrated at $1^{st}$ metal connection 515, are directed vertically and $2^{nd}$ metal connections, representatively illustrated at $2^{nd}$ metal connection 520, are directed horizontally, with power taps, representatively illustrated at power tap 525, being placed as needed. The illustrated embodiment of FIG. 5 demonstrates the efficient use of $1^{st}$ metal connection 510 to strap the output of p-type "A" transistors to the input of p-type "B" transistors in a vertical cell abutment to form the AOI22 logic cell 500.

Figure 6:
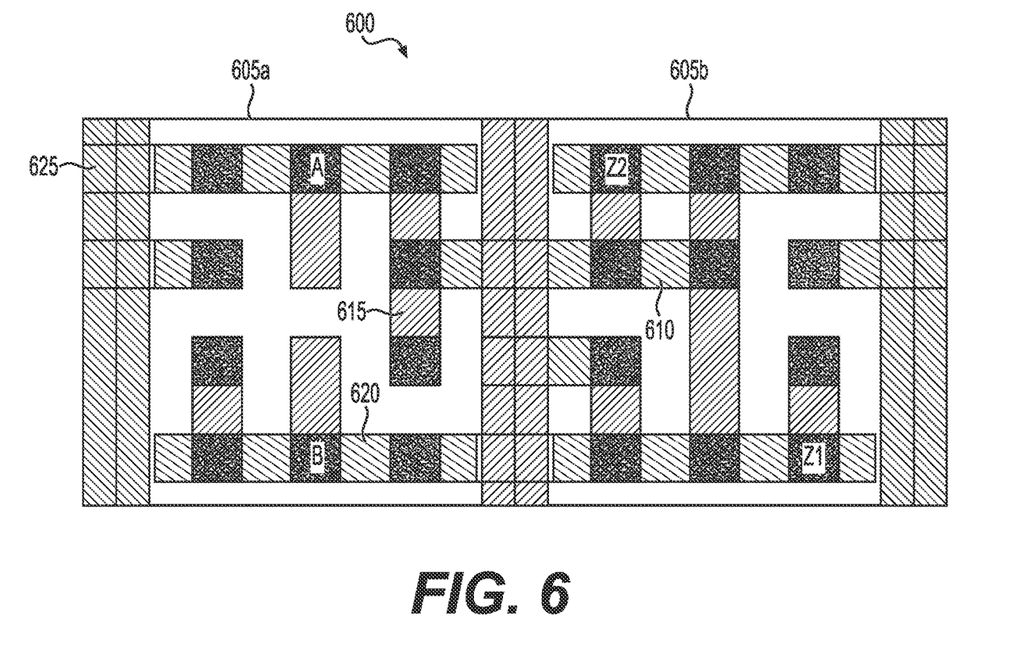
FIG. 6 is an illustration of a top-down view of a pair of unit cells as functionalized into a two input and (AND2) logic cell in accordance with the principles described herein.

FIG. 6 is an illustration of a top-down view of a pair of unit cells 605a and 605b, each of which can be constructed identically to unit cell 100 of FIGS. 1 and 2, as functionalized into a two input and (AND2) logic cell 600, essentially a two input not-and circuit (NAND2 in unit cell 605a) connected to a dual-output inverter circuit (INV2 in unit cell 605b). With similarity to FIG. 4, $1^{st}$ metal connections, representatively illustrated at $1^{st}$ metal connection 615, are directed vertically and $2^{nd}$ metal connections, representatively illustrated at $2^{nd}$ metal connection 620, are directed horizontally, with power taps, representatively illustrated at power tap 625, being placed as needed. The illustrated embodiment of FIG. 6 demonstrates the efficient use of $2^{nd}$ metal connection 610 to strap the output of the NAND2 circuit to the gate of the INV2 circuit in a horizontal abutment to form the AND2 logic cell 600.

Figure 7:
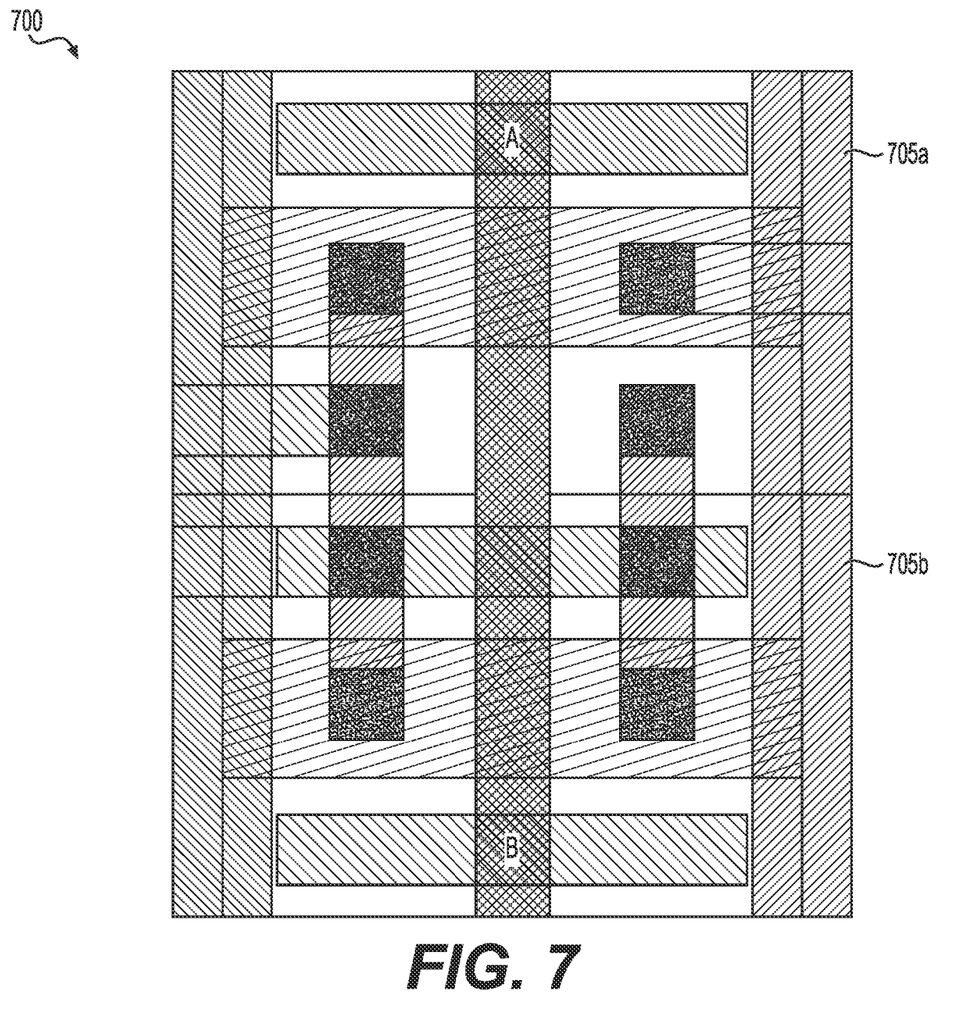
FIG. 7 is an illustration of a top-down view of a pair of unit cells, each of which having a single CFET pair in their respective active device stacks as opposed to two CFET pairs, functionalized into a two input not-and (NAND2) logic cell in accordance with the principles described herein.

FIG. 7 is an illustration of a top-down view of a pair of unit cells 705a and 705b, each of which having a single CFET pair in their respective active device stacks as opposed to two CFET pairs of the embodiment of FIGS. 1 and 2. FIG. 7 demonstrates how the design methodology described herein can be applied to other 3Di approaches. In the illustrated embodiment of FIG. 7, a two input not-and (NAND2) logic cell 700 is constructed by way of functionalization techniques similar to those described above.

Table 1 shows sample area scaling achieved with techniques herein compared to a relatively aggressive 5T 2D design. Note that the scaling factors show a significant scaling benefit provided by techniques herein.

TABLE 1

| Cell | 2D Size | 3D Size | Scale Factor |
| --- | --- | --- | --- |
| AOI22 | 5cpp × 5T = 25 | 2cpp × 4T × 2 = 16 | 16/25 = 0.64 |
| NAND2 | 3cpp × 5T = 15 | 2cpp × 4T = 8 | 8/15 = 0.53 |
| AND | 5cpp × 5T = 25 | 4cpp × 4T = 16 | 16/25 = 0.64 |
| INV2 | 3cpp × 5T = 15 | 2cpp × 4T = 8 | 8/15 = 0.53 |

Embodiments of the inventive concepts described herein can include an integrated circuit or semiconductor device with an array of uniform unit cells. A fixed footprint (width and height) unit cell contains all front end-of-line (FEOL, e.g., device, source/drain, gate) and middle end-of-line (MEOL, e.g., local interconnect) constructs. A uniform and fixed-pitch array of contacts may be provided to route all signal and power connections to an accessible plane above the device stack. A set of local power rails running parallel to the polysilicon gate connections may use the space of diffusion breaks. Logic synthesis can be realized by abutting unit cells either horizontally (i.e., forming a wide standard logic cell) or vertically (i.e., forming a tall standard logic cell). A set of regular and unidirectional metal shapes may be used to functionalize the unit cells either into standard cell logic or for large block synthesis (e.g., mapping large logic blocks into local wiring of an array of unit cells).

In the preceding description, specific details have been set forth, such as a particular geometry and descriptions of various components and processes used to construct such components. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

Of course, the order of discussion of the different steps as described herein has been presented for clarity sake. In general, these steps can be performed in any suitable order. Additionally, although each of the different features, techniques, configurations, etc., herein may be discussed in different places of this disclosure, it is intended that each of the concepts can be executed independently of each other or in combination with each other. Accordingly, the present invention can be embodied and viewed in many different ways.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefor, elements and methods individually described may be combined, and elements described as discrete may be distributed across many components. The scope of the invention should therefore be determined not with reference to the description above, but with reference to the appended claims, along with their full range of equivalents.

The invention claimed is:

1. An integrated circuit comprising:
   unit cells arranged in an array, each unit cell comprising:
   field effect transistors arranged in a stack;
   local interconnect structures comprising select conductive paths between select terminals of the field effect transistors to define cell circuitry that is confined within the unit cell; and
   an array of contacts disposed on an accessible surface of the unit cell, each contact being electrically coupled to a corresponding electrical node of the cell circuitry, wherein:
   the unit cells each have a common footprint and are positioned in the array so that diffusion breaks embracing the cell circuitry of each unit cell align with the diffusion breaks in adjacent unit cells to form continuous spaces that extend across all unit cells in respective columns of the array, and
   the integrated circuit further comprising power contacts disposed in the continuous spaces, wherein the power contacts extend vertically from a substrate to the accessible surface of the unit cells and form power walls that provide electrical power to at least the unit cells in the respective columns of the array, and wherein the power walls extend lengthwise in a direction parallel to a length of the diffusion breaks.

2. The integrated circuit of claim 1, further comprising a functionalization layer comprising electrically conductive wiring segments formed between select contacts on respective accessible surfaces of one or more unit cells in the array.

3. The integrated circuit of claim 1, wherein surfaces of the power contacts are exposed on the accessible surface of each unit cell in the respective columns of the array.

4. The integrated circuit of claim 1, wherein surfaces of the respective power contacts are connected to buried power rails.

5. The integrated circuit of claim 1, wherein the cell circuitry is identical across all unit cells in the array.

6. The integrated circuit of claim 5, wherein the cell circuitry is constructed from front end-of-line and middle end-of-line structures that extend across the unit cells.

7. The integrated circuit of claim 6, wherein the front-end of line and middle-end of line processes include multiplication patterning processes.

8. The integrated circuit of claim 7, wherein the multiplication patterning processes include directed self-assembly and/or self-aligned double patterning.

9. The integrated circuit of claim 1, wherein the field effect transistors are stacked in complementary pairs.

10. The integrated circuit of claim 9, wherein gates of each of the complementary pairs of field effect transistors are electrically connected to one another.

11. The integrated circuit of claim 10, wherein the complementary pairs in the stack of field effect transistors is greater than one in number.

12. The integrated circuit of claim 1, wherein the field effect transistors are stacked in planes that are parallel to the accessible surface.

13. The integrated circuit of claim 1, wherein the integrated circuit is monolithic.

14. The integrated circuit of claim 1, wherein:
   the unit cells comprise a first unit cell in abutment with a second unit cell; and
   at least one metal strap connecting a contact of the first unit cell to a contact of the second unit cell to form a synthesis logic circuit from the first and second unit cells.

15. The integrated circuit of claim 14, wherein the first and second unit cells are either in vertical abutment in a column of the array to form the logic circuit as a relatively tall standard cell, or in horizontal abutment in a row of the array to form the logic circuit as a relatively wide standard cell.

16. The integrated circuit of claim 2, wherein the electrically conductive wiring segments are unidirectional.

17. An integrated circuit comprising:
   electrical contacts disposed across a surface beneath which identical unit cells are constructed, each unit cell comprising:
   transistors arranged in a stack, and
   local interconnect structures comprising select conductive paths between select terminals of the transistors to define cell circuitry that is confined within the unit cell, wherein select nodes of the cell circuitry are connected to the electrical contacts disposed over the stack of transistors of each unit cell; and power contacts disposed in continuous spaces between groups of the unit cells, wherein the power contacts extend vertically from a substrate to a surface of the unit cells and form power walls that provide electrical power to at least the unit cells in the corresponding group thereof, and wherein the power walls extend lengthwise in a direction parallel to a length of diffusion breaks that form the continuous spaces.

18. The integrated circuit of claim 17, further comprising a functionalization layer including electrically conductive wiring segments formed between select ones of the electrical contacts.

19. The integrated circuit of claim 17, wherein select ones of the local interconnect structures are connected to at least one of the power contacts.

20. The integrated circuit of claim 17, wherein the transistors are stacked in planes that are parallel to the surface on which the electrical contacts are disposed.

* * * * *